United States Patent

Matsunaga et al.

Patent Number: 5,830,807
Date of Patent: Nov. 3, 1998

[54] SUCCESSIVE DRY ETCHING OF ALTERNATING LAMINATE

[75] Inventors: Daisuke Matsunaga; Kazuo Hashimi; Genichi Komuro, all of Kawasaki, Japan

[73] Assignee: Fujitsu Limited, Kanagawa, Japan

[21] Appl. No.: 866,046

[22] Filed: May 30, 1997

Related U.S. Application Data

[63] Continuation of Ser. No. 404,523, Mar. 15, 1995, abandoned.

[30] Foreign Application Priority Data

Mar. 18, 1994 [JP] Japan .................................. 6-048878

[51] Int. Cl.$^6$ .............................. H01L 21/00; B44C 1/22; C23F 1/00; C23F 3/00
[52] U.S. Cl. ........................ 438/714; 438/710; 438/713; 438/719; 438/723; 216/68; 216/70; 216/79
[58] Field of Search ................... 216/68, 70, 79; 438/710, 713, 714, 719, 723

[56] References Cited

U.S. PATENT DOCUMENTS

| | | | |
|---|---|---|---|
| 4,162,185 | 7/1979 | Coburn et al. | 156/643.1 |
| 4,180,432 | 12/1979 | Clark | 156/643.1 |
| 4,377,436 | 3/1983 | Donnelly et al. | 156/626.1 |
| 4,615,764 | 10/1986 | Bobbio et al. | 156/643.1 |
| 5,013,398 | 5/1991 | Long et al. | 156/643.1 |
| 5,505,816 | 4/1996 | Barnes et al. | 438/723 |
| 5,620,526 | 4/1997 | Watatani et al. | 216/79 |

FOREIGN PATENT DOCUMENTS

| | | | |
|---|---|---|---|
| 6-168915 | 6/1994 | Japan | 156/643.1 |
| 6-283477 | 10/1994 | Japan | 156/643.1 |

*Primary Examiner*—Glenn Caldarola
*Assistant Examiner*—J. Pasterczyk
*Attorney, Agent, or Firm*—Nikaido, Marmelstein, Murray & Oram LLP

[57] ABSTRACT

A laminated structure formed by alternately laminating a silicon film and a silicon oxide film is successively etched in the same chamber. Two groups are selected from groups A, B, and C, the group A including $NF_3$, $CF_4$, and $SF_6$, the group B including CO, $CHF_3$, $CH_2F_2$, $C_2F_6$, $C_3F_8$, and $C_4F_8$, and the group C including $Cl_2$, HBr, HCl and $Br_2$. The laminated structure is etched by successively etching one of the silicon film and the silicon oxide film by a combination of gases having a first mixture ratio and the other by the combination of gases having a second mixture ratio different from the first mixture ratio, the combination of gases including at least one kind of gas selected from one group of the selected two groups and at least one kind of gas selected from the other group. A technology of manufacturing a semiconductor device is provided which can etch an alternate laminate efficiently with a simple system.

11 Claims, 5 Drawing Sheets

FIG.3A
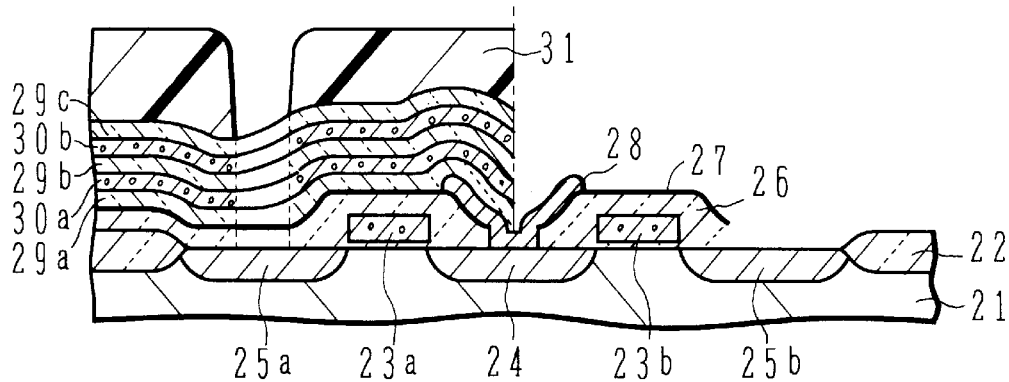
FIG.3B
FIG.3C
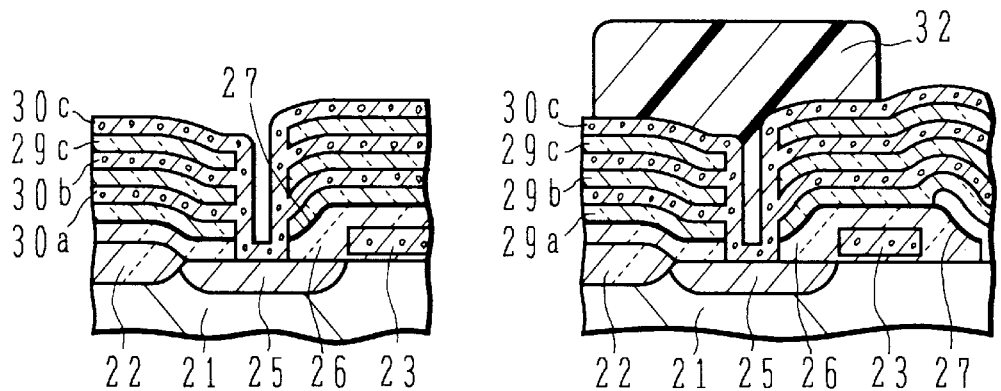
FIG.3D
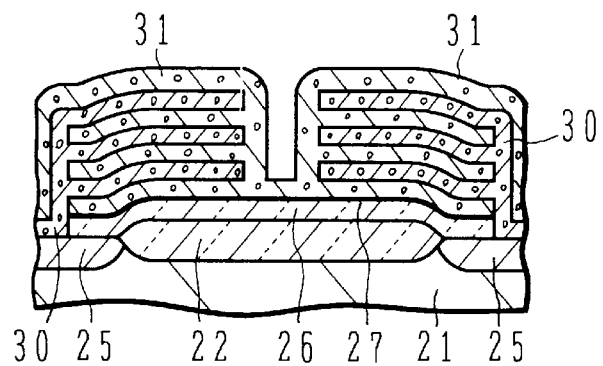

SUCCESSIVE DRY ETCHING OF ALTERNATING LAMINATE

This application is a continuation of application Ser. No. 08/404,523 filed Mar. 15, 1995, now abandoned.

BACKGROUND OF THE INVENTION a) Field of the Invention

The present invention relates to a technology of manufacturing semiconductor devices, and more particularly to a technology of manufacturing semiconductor devices including a process of etching an alternate laminate of silicon films and silicon oxide films, for example, to be used to form a DRAM capacitor of a multi-layer structure or other elements.

b) Description of the Related Art

As the integration density becomes high, the ultra-LSI structure is becoming three-dimensionally complicate. One issue concerning a dynamic random access memory (DRAM) is to reduce the wafer area occupied by each memory cell as small as possible. In order to ensure a reliable storage function, it is necessary for the memory capacitor to have a capacitance larger than a certain value. In order to form a capacitor having a certain capacitance value or larger in as small a wafer area as possible, various capacitor structures having a three dimensional configuration, typically a stacked capacitor structure, have been proposed.

A fin type capacitor such as a stacked capacitor is formed by the following processes. First, a silicon film and a silicon oxide film are alternately laminated to form a laminate film. The silicon film is made of, for example, polycrystalline silicon or amorphous silicon. The silicon oxide film may be, for example, a high temperature oxide film. A contact hole is formed in the laminate film, the hole reaching the surface of a semiconductor substrate. After the contact hole is formed, another silicon film is deposited by low pressure CVD. A plurality of laminated silicon films, the exposed substrate surface, and the last deposited silicon film, are electrically connected together.

Thereafter, the region where a storage electrode formed, is covered with a mask. The region not covered with the mask is anisotropically etched from the surface of the silicon film at the highest level to the bottom of the silicon film at the lowest level. Next, the silicon oxide films between the silicon films are etched from the exposed side surfaces to expose fin structures of the silicon films. A thin insulating film (a silicon oxide film/a silicon nitride film) is formed on the exposed surfaces of the silicon films. Another silicon film is again deposited by low pressure CVD to fill the spaces between the fins and continuously form an opposing electrode.

In the above manner, a capacitor structure is formed. The capacitor structure is constituted by a pair of silicon film structures of a multi-layer structure, the silicon films facing each other with a thin insulating film being interposed therebetween.

In forming such a capacitor of a DRAM, the alternate laminate of silicon films and silicon oxide films is required to be etched when a contact hole is formed and when a storage electrode is patterned.

Conventionally, silicon oxide films have been etched by a mixed gas of $CF_4$ and $CHF_3$, and silicon films have been etched by $Cl_2$ or HBr. These etching processes have been performed by using independent etching systems.

If silicon films and silicon oxide films are etched by using independent etching systems, two or more etching systems are necessary, raising the manufacturing cost. Wafers are required to be transported among these etching systems.

At each transport, a wafer is picked up from an etching system and transported to another etching system so that a photoresist film on the wafer is exposed in the air several times. The characteristics of the photoresist on the wafer exposed in the air may change because it absorbs moisture in the air, and the reproducibility of etching is lowered.

Two or more etching systems may be coupled by vacuum transport passages so as not to expose a wafer in the air. In this case, the system cost is increased, the system becomes bulky, and each system cannot be used efficiently so that the operation rate of systems is lowered.

It is possible to use a single etching system by using etchant gases of $CF_4+CHF_3$ for the etch of silicon oxide films and by replacing the etchant gases by another etchant gas $Cl_2$ or HBr for the etch of silicon films. However, if the replaced gas contains some residue of the gas first used, the etching precision is degraded.

If such a mixed gas is to be avoided, a long evacuation time is required to be inserted between adjacent or succeeding etching steps. Apart from the above, Cl-based by-products and F-based by-products are alternately deposited on the inner wall of the etching chamber. Even if a long evacuation time is inserted, out-gas of the deposited by-products becomes non-negligible as the etching process is repeated, the two types of steps interfere each other in terms of the process characteristics so that the etching becomes unstable.

Alternate deposition of Cl-based by-products and F-based by-products makes a laminate of two types of layers having a different thermal expansion coefficient. This laminate becomes likely to be peeled off as flakes even in a short time etching process. If some of these flakes drop on a wafer, the manufacturing yield of good devices is considerably lowered.

The number of etching steps increases as the number of laminated films increases. The durability of a photoresist film becomes insufficient as the number of etching steps increases, and a precise anisotropic shape becomes difficult to be formed.

As described above, it has been difficult conventionally to etch an alternate laminate of silicon films and silicon oxide films by a simple etching system efficiently and at high precision.

SUMMARY OF THE INVENTION

It is an object of the present invention to provide a technology of manufacturing a semiconductor device, being capable of efficiently etching an alternate laminate of silicon films and silicon oxide films by a simple etching system.

It is another object of the present invention to provide a technology of manufacturing a semiconductor device, being capable of highly precisely etching an alternate laminate of silicon films and silicon oxide films by a simple etching system.

According to one aspect of the present invention, there is provided a method of manufacturing a semiconductor device including the steps of: forming an etching mask on a laminated structure formed by alternately laminating a silicon film and a silicon oxide film; loading the laminated structure in a dry etching chamber, selecting two groups from groups A, B, and C, the group A including $NF_3$, $CF_4$, and $SF_6$, the group B including CO, $CHF_3$, $CH_2F_2$, $C_2F_6$, $C_3F_8$, and $C_4F_8$, and the group C including $Cl_2$, HBr, and $Br_2$, and etching the laminated structure by successively etching one of the silicon film and the silicon oxide film by a combination of gases having a first mixture ratio and the other by the combination of gases having a second mixture ratio different from the first mixture ratio, the combination of gases including at least one kind of gas selected from one group of the selected two groups and at least one kind of gas selected from the other group of the selected two groups.

Silicon films and silicon oxide films can be successively etched by a combination of gases selected from the two groups of groups A, B, and C, the combination of gases including one kind of gas selected from one group and one kind of gas selected from the other group. The etching rates of a silicon film and a silicon oxide film can be controlled by changing the mixed ratio of gases. By using at least one common gas for both the etching steps, the etching processes can be easily interchanged.

BRIEF DESCRIPTION OF THE DRAWINGS

FIGS. 3A to 3D are schematic cross sectional views explaining a method of manufacturing a semiconductor device including the successive etching processes of an alternate laminate of silicon films and silicon oxide films, according to an embodiment of the present invention.

DETAILED DESCRIPTION OF THE PREFERRED EMBODIMENTS

Figure 1A:
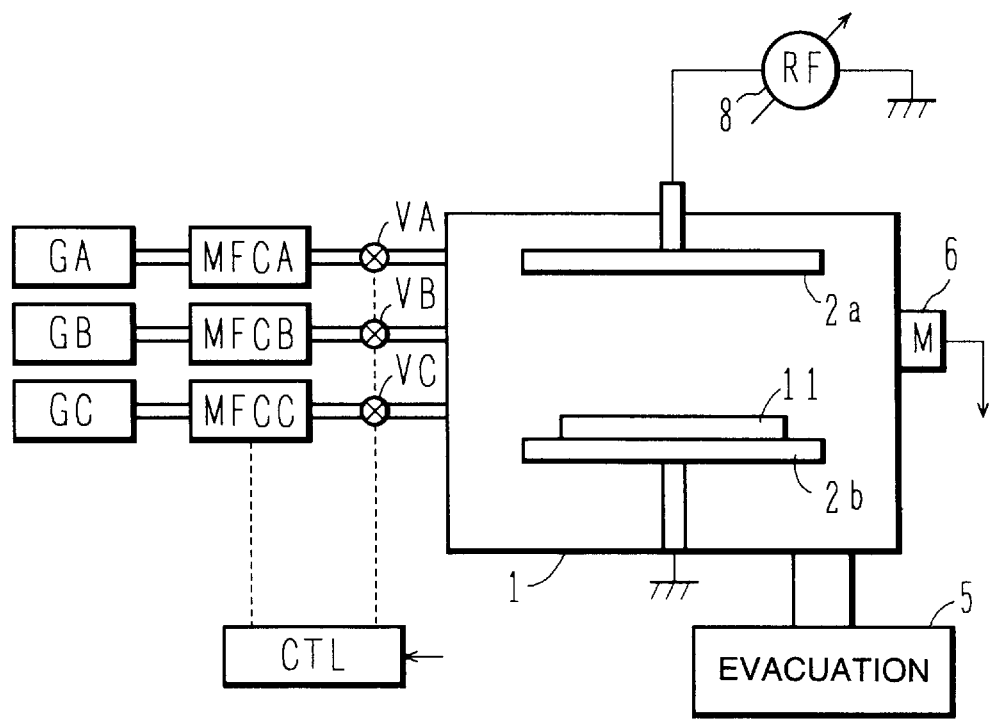
FIGS. 1A and 1B are schematic cross sectional views showing an etching system and a wafer structure to be etched, according to an embodiment of the invention.

In the following description of the preferred embodiments of the invention, symbols having the same reference numeral but with different alphabetical suffixes may occasionally be collectively referred to only by the reference numeral. For example, as will be discussed below, FIG. 1B illustrates oxide films 12a, 12b, 12c and 12d; in the following discussion, these films may collectively be referred to as oxide films 12.

Figure 1B:
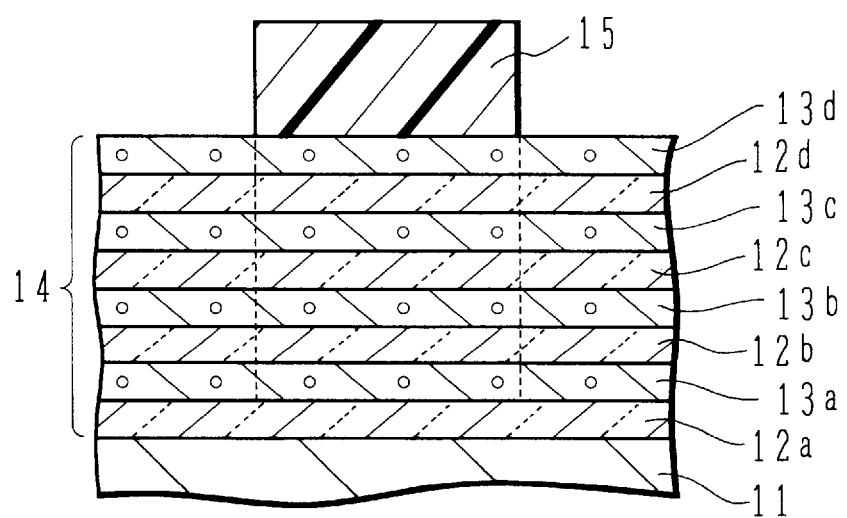

FIGS. 1A and 1B are schematic cross sectional views showing an etching system according to an embodiment of the invention, and an alternate laminate of silicon films and silicon oxide films to be etched.

Referring to FIG. 1A, the etching system has an etching chamber 1 made of stainless steel or other materials. Parallel plate electrodes 2a and 2b made of stainless steel or other materials are disposed at the upper and lower positions in the etching chamber 1. The plate electrode 2a is connected to a high frequency (RF) power source, and the other plate electrode 2b is grounded. An evacuation system 5 is coupled to the etching chamber 1 to evacuate the inside of the etching chamber 1 to a desired vacuum degree.

Three kinds of gas sources GA, GB, and GC are coupled to the etching chamber 1 via mass flow controllers MFCA, MFCB, and MFCC, and valves VA, VB, and VC. The gas source GA supplies at least one of gases $NF_3$, $CF_4$, and $SF_6$. The gas source GB supplies at least one of gases CO, $CHF_3$, $CH_2F_2$, $C_2F_6$, $C_3F_8$, and $C_4F_8$. The gas source GC supplies at least one of gases $Cl_2$, HBr, and $Br_2$. In other words, the gas source GA supplies a F-based gas, and the gas source GC supplies a halogen-based gas other than the F-based gas. Each mass flow controller MFC and each valve V is controlled by a controller CTL to control the gas flow rate.

A wafer 11 to be etched is disposed on the lower electrode 2a of the parallel plate electrodes 2a and 2b.

Two kinds of gases selected from the gas sources GA, GB, and GC are supplied to the etching chamber 1 to form a mixed etchant gas. Plasma discharge is generated between the parallel plate electrodes 2a and 2b by supplying a high frequency power from the high frequency power source 8 to the parallel plate electrodes 2a and 2b, to perform etching. Radiative light in plasma is detected by a monitor 6, and its detection signal is supplied to the controller CTL.

FIG. 1B shows a laminate structure of a wafer to be etched. On a silicon substrate 11, an alternate laminate 14 of silicon oxide films 12a–12d and silicon films 13a–13d is formed. The silicon films 13a–13d are made of polycrystalline silicon or amorphous silicon. On the alternate laminate 14, a resist pattern 15 made of photoresist such as novolak resin is formed.

The wafer 11 having such a structure is placed on the electrode 2b, and two kinds of gases selected from the gas sources GA, GB, and GC are controlled by the mass flow controllers MFC to obtain a desired mixture ratio of etchant gases in the etching chamber 1.

In etching the alternate laminate of silicon films and silicon oxide films shown in FIG. 1B, at least one kind of gas is continuously supplied and the gas mixture ratio is changed in accordance with the material of a film to be etched.

Figure 2C:
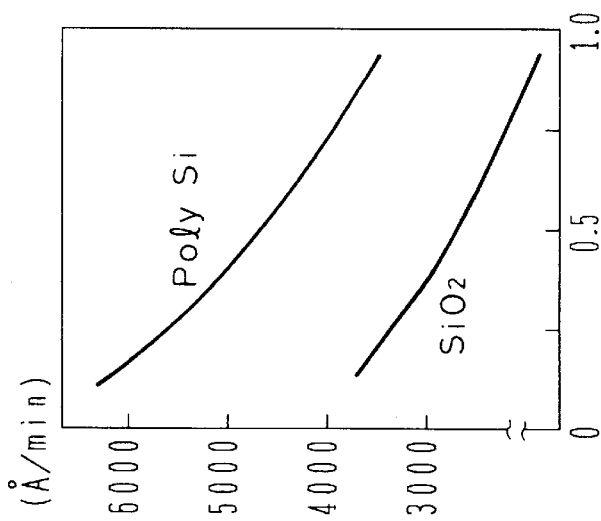
FIGS. 2A to 2C are graphs showing an etching rate of a silicon film and a silicon oxide film relative to a mixture ratio of two kinds of etchant gases.
Figure 2B:
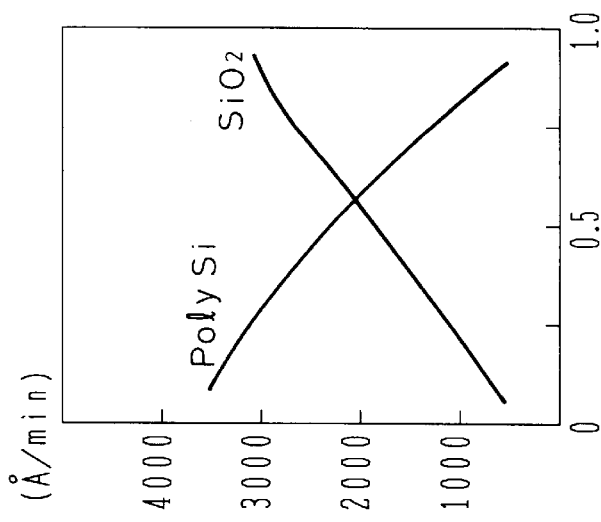
Figure 2A:
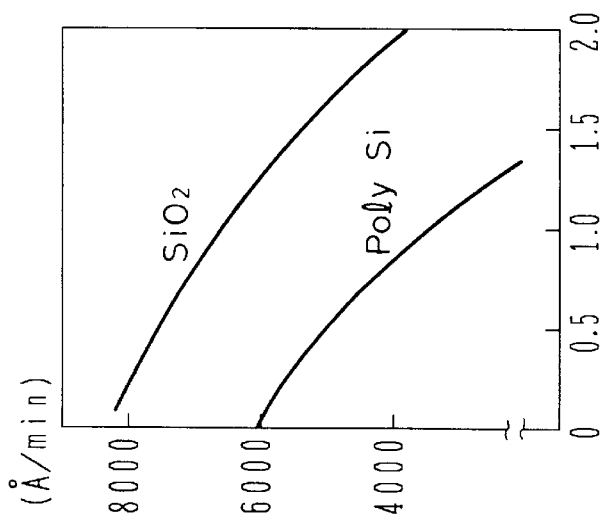

FIGS. 2A to 2C are graphs showing change in the etching rate of silicon oxide ($SiO_2$) and polycrystalline silicon (Poly Si) relative to a mixture ratio of two kinds of gases.

FIG. 2A is a graph showing an etching rate when a mixed gas of $CF_4$ and $CHF_3$ is used as etchant. When $CHF_3$ is not added at all, silicon oxide and polycrystalline silicon are both efficiently etched. Here, etching rate of silicon oxide is higher than that of silicon. As the flow rate of $CHF_3$ is increased, the etching rate of silicon oxide monotonically decreases, whereas the etching rate of polycrystalline silicon rapidly decreases.

For example, if the mixture ratio of $CHF_3$ to $CF_4$ is set to 1 to 2, the etching rate of polycrystalline silicon becomes extremely low, and only silicon oxide is substantially etched. Similar tendency appears also in the case of amorphous silicon or single crystal silicon. If the mixture ratio is set to 0 to 0.2, when an exposed surface is polycrystalline silicon it can be etched efficiently.

For example, an alternating laminate of polycrystalline layers and silicon oxide layers can be etched in a parallel plate reactive ion etching (RIE) apparatus using an RF power source of 380 kHz and employing a substrate temperature of −15° C. which is controlled by a chiller. Respective etching conditions for each polycrystalline Si layer and each silicon oxide layer are as follows;

TABLE

|  | Etching of Polycrystalline Si | Etching of Silicon Oxide |
| --- | --- | --- |
| RF-Power | 650 W | 800 W |
| Pressure | 240 mTorr | 240 mTorr |
| CHF$_3$ | 0 sccm | 12 sccm |
| CF$_4$ | 80 sccm | 8 sccm |
| Ar | 0 sccm | 120 sccm |

FIG. 2B is a graph showing an etching rate of polycrystalline silicon and silicon oxide when a mixed gas of Cl$_2$ and CHF$_3$ is used as etchant. If most of the mixed gas is Cl$_2$ (near 0 on the abscissa), the etching rate of polycrystalline silicon is considerably high as compared to that of silicon oxide. If most of the mixed gas is CHF$_3$ (near 1 on the abscissa), the etching rate of silicon oxide becomes considerably high as compared to that of polycrystalline silicon. Therefore, by changing the main composition of the mixed gas of CHF$_3$ and Cl$_2$, polycrystalline silicon and silicon oxide can be selectively etched.

FIG. 2C is a graph showing an etching rate of polycrystalline silicon and silicon oxide when a mixed gas of SF$_6$ and HBr is used as etchant. In this case, the etching rate of polycrystalline silicon is always higher than silicon oxide, independently from the composition of the mixed gas. If the flow rate of HBr is made large, the etching rate of silicon oxide becomes considerably low and only polycrystalline silicon is substantially etched. As the flow rate of SF$_6$ is increased, not only polycrystalline silicon but also silicon oxide is etched.

For example, by using the mixed gas supply system of CF$_4$ and CHF$_3$ shown in FIG. 2A, silicon oxide is etched at a flow ratio of CHF$_3$/CF$_4$=1 to 2, and polycrystalline silicon is etched by CF$_4$. CF$_4$ is the common etchant gas for the two types of etching processes.

Etching polycrystalline silicon only by CF$_4$ often progresses isotropically. If anisotropic etching is desired, it is preferable to add a small amount of CHF$_3$ to CF$_4$. For example, the flow ratio of CHF$_3$/CF$_4$ is set to be higher than 0 and equal to or lower than 0.2. In this case, both CHF$_3$ and CF$_4$ become the common etchant gases for the two types of etching processes.

As another alternate etching method using the mixed gas of Cl$_2$ and CHF$_3$, for example, polycrystalline silicon is etched at a flow ratio of CHF$_3$/(Cl$_2$+CHF$_3$) higher than 0 and equal to or lower than 0.2, and silicon oxide is etched at a flow rate of Cl$_2$/(Cl$_2$+CHF$_3$) higher than 0 and equal to or lower than 0.2. Here, one of the above flow ratios may be set to 0.

With this etching, silicon oxide and polycrystalline silicon are generally alternately etched selectively. At least one of CHF$_3$ and Cl$_2$ becomes the common etchant gas for the two types of etching processes.

As still another alternate etching method using the mixed gas of HBr and SF$_6$, for example, polycrystalline silicon is etched at a flow ratio of SF$_6$/(SF$_6$+HBr) set to 0 to 0.2, and silicon oxide is etched at a flow ratio of HBr/(SF$_6$+HBr) set to 0.05 to 0.2. In this case, at least HBr becomes the common etchant gas for the two types of etching processes.

These etching processes allow silicon oxide and polycrystalline silicon to be alternately etched by using at least one common etchant gas in the same etching chamber.

Since the common etchant gas is used, the etching precision is less degraded by an undesired mixture of etchant gases and the reproducibility can be ensured. The manufacturing yield of good devices can therefore be improved.

Since the two types of etching processes can be conducted in the same etching chamber, the cost of an etching system can be reduced and the operation rate of the system can be improved.

The etchant gases may be exchanged among CF$_4$, SF$_6$, and NF$_3$ having a similar etching function, among CHF$_3$, CO, CH$_2$F$_2$, C$_2$F$_6$, C$_3$F$_8$, and C$_4$F$_8$ having a similar etching function, and among Cl$_2$, HBr, and Br$_2$ having a similar etching function.

FIGS. 3A to 3D are schematic cross sectional views explaining the processes of forming a DRAM capacitor by an alternate etch successively changing the etchant gas ratio.

As shown in FIG. 3A, on the surface of a p-type silicon substrate 21, a field oxide (SiO$_2$) film 22 is selectively formed by LOCOS. On the surfaces of active regions, a pair of insulated gate electrodes 23a and 23b made of polycrystalline silicon or polycide is formed with a thin thermal oxide film being interposed therebetween. By using the gate electrodes and the field oxide film as a mask, n-type ions are implanted to form n-type regions 24, 25a, and 25b. The n-type region 24 is a common source/drain region of two transistors. The n-type regions 25a and 25b are source/drain regions to which the storage electrode of a capacitor is connected.

A silicon oxide film 26 is formed to cover the gate electrode 23. An opening is formed in the silicon oxide film 26 by photolithography, the opening reaching the source/drain region 24. A conductive layer 28 as a bit line made of silicide, polycide, or other conductive material is deposited and patterned to form a bit line. A silicon nitride film 27 is formed on the substrate surface covering the patterned conductive layer 28.

A silicon oxide film 29a is deposited covering the nitride film 27 and the conductive layer 28. On the silicon oxide film 29a, silicon films 30a and 30b and silicon oxide films 29b and 29c are alternately deposited. In this manner, two layers of silicon films 30 separated by the silicon oxide films 29 are laminated. This laminate is not depicted at the right half of FIG. 3A.

A photoresist layer is coated on the silicon oxide film 29c, exposed and developed to form a photoresist pattern 31. An opening of the photoresist pattern 31 is formed over the source/drain region 25.

Thereafter, by an alternate etch successively changing an etchant gas ratio described earlier, an alternate laminate of silicon films and silicon oxide films is etched at the region of the photoresist opening to form a contact hole exposing the source/drain region 25. Although there exists the silicon nitride layer 27 in the area to be etched, the silicon nitride layer 27 can be very thin, for example about 20 nm which can withstand the wet etching by HF solution used for etching off the CVD oxide film 26, and therefore can be etched by the same etching condition as the above-mentioned conditions for etching silicon oxide layer. Selection ratio of etching SiN with respect to SiO$_2$ is about half.

As shown in FIG. 3B, after the contact hole exposing the source/drain region 25 is formed, another silicon film 30c is deposited by low pressure CVD. This silicon film 30c is electrically connected to both the source/drain region 25 and the other silicon films 30b and 30a.

As shown in FIG. 3C, a photoresist film is coated and patterned to form a photoresist pattern 32 which covers the silicon films to be left as the storage electrode.

By using the photoresist pattern 32 as an etching mask, the alternate laminate of the silicon films 30 and silicon oxide films 29 at the exposed region is removed by an alternate etch successively changing an etchant gas ratio described earlier. In this etching, it is required not to expose the surface of the silicon nitride film 27. For example, when three polycrystalline silicon films 30a, 30b, and 30c and two CVD silicon oxide films 29b, and 29c are being etched, the progress of etching is monitored by a usual end point detector or monitors, each of which detects the emission light from the etching plasma to monitor the waveform of the emission. The end point of the polycrystalline silicon layer 30a or the beginning point of the silicon oxide film 29a, or both are detected, depending on the property of the end point monitor or monitors. After detecting the interface of the silicon layer 30a and the silicon oxide layer 29a, certain amount of over-etching is performed and then etching is stopped at an intermediate point of the silicon oxide film 29a. In this manner, the silicon films as the storage electrode and the silicon oxide films interposed between the silicon films are etched and patterned. Next, the silicon oxide films are removed from the exposed side surfaces by diluted hydrofluoric acid aqueous solution or the like. With the silicon oxide films being removed, a multi-layer fin structure made of silicon films is exposed.

As shown in FIG. 3D, after an insulating film such as a silicon oxide film or a silicon nitride film or a combination thereof is formed on the surface of the exposed silicon film structure 30, another silicon film is deposited by low pressure CVD so as to fill all spaces between the silicon films of the fin structure. The silicon fin structure 30 and the silicon film 31 face each other with the thin insulating film interposed therebetween. In this manner, a stacked capacitor is formed.

In the case of using $CF_4$ and $CHF_3$ as the etchant, if the flow rate of $CHF_3$ is set larger than that of $CF_4$, the etched film, particularly a silicon oxide film, shows a taper side wall.

When the amount of gas belonging to the group B is increased, relative to the gas of group A, deposition on the side surface is enhanced and a larger tapering will be produced. Similarly, in the case of using gases belonging to group B and group C, when the amount of gas belonging to group B is increased relative to the gas belonging to group C, larger tapering will be produced. In the case of using gases belonging to group A and group C, when the amount of gas belonging to group C is increased relative to the gas belonging to group A, larger tapering will be produced.

When the pressure is made lower, more directivity or anisotropy will be given to the etching. When the pressure is higher and the amount of gas belonging to group 13 is high, more tapering will be produced. When the pressure is high and the amount of gas belonging to group B is low, undercutting will be produced.

When the power is high, more anisotropy or directivity will be given to the etching. When the power is low and the amount of gas belonging to group B is high, more tapering will be produced. When the power is low and the amount of gas belonging to group B is low, undercutting will be produced.

Figure 4A:
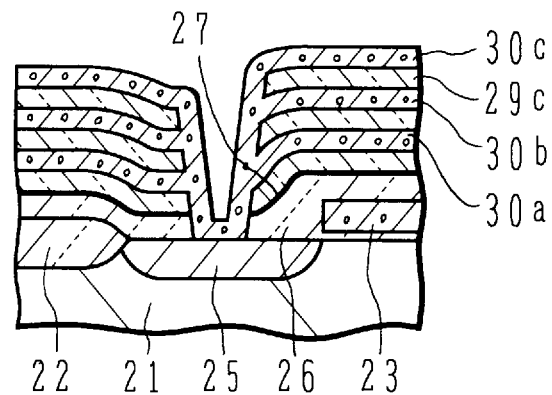
FIGS. 4A and 4B are schematic cross sectional views explaining a method of manufacturing a semiconductor device including the successive etching processes of an alternate laminate of silicon films and silicon oxide films, according to still another embodiment of the present invention.
Figure 4B:
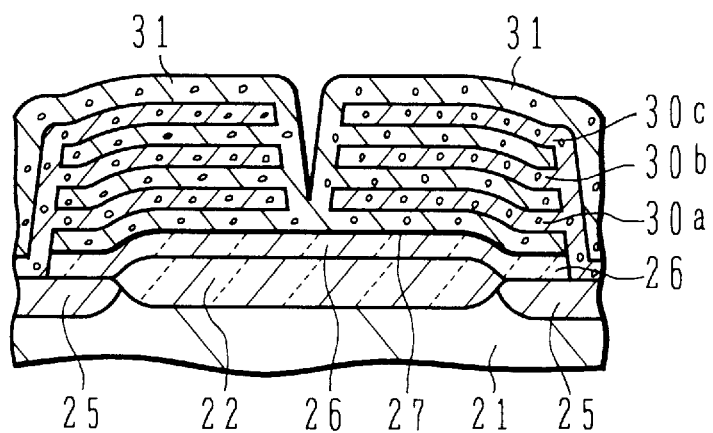

FIGS. 4A and 4B are schematic cross sectional views explaining a method of forming a DRAM capacitor structure by using such a taper side wall. As shown in FIG. 4A, after an alternate laminate of silicon oxide films 29a, 29b, and 29c and silicon films 30a and 30b is formed on a silicon substrate 21, the alternate laminate is taper-etched to form a contact hole exposing a source/drain region 25. Thereafter, a silicon film 30c is deposited. Because of the tapered side wall, the step coverage of the silicon film 30c is improved.

A taper etch is also performed when the alternate laminate of silicon films and silicon oxide films at the region other than the storage electrode is etched.

As shown in FIG. 4B, after the storage electrode 30 is etched to have a taper side wall, an insulating film is formed on the surface of the storage electrode, and a silicon film 31 serving as the opposing electrode is deposited. Also in this case, because of the taper side wall of the silicon film 30 as the storage electrode, the step coverage of the opposing electrode 31 is improved.

By utilizing the tapered etching, the size or area of the films 29a, 29b and 29c can be arranged to satisfy the relation 29a<29b<29c. The size of the photoresist mask is transferred to the film 29c, and the sizes of the films 29b and 29a gradually increase by the tapered etching which proceed while depositing the reaction product of etching on the side surface.

In forming a capacitor at the same patterning precision, the area of a storage electrode can, in some cases, be increased positively utilizing the slanted side surface formed by the taper etch. By using the taper etch to form a contact hole for the storage electrode and the doped region in the substrate, variation of the areas of the contact hole inner wall can be stabilized and the manufacturing process is made highly reliable.

In successively etching an alternate laminate of silicon films and silicon oxide films, it is preferable to make the film at the highest level have a lower etching rate relative to selected etchant gas combinations.

Figure 5A:
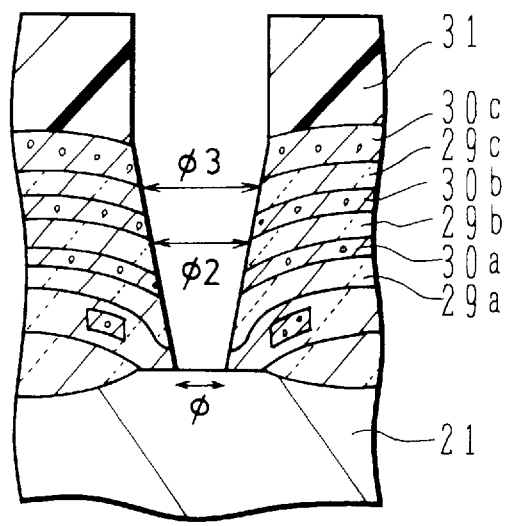
FIGS. 5A and 5B are a schematic cross sectional view and a graph explaining a method of manufacturing a semiconductor device including the successive etching processes of an alternate laminate of silicon films and silicon oxide films, according to a further embodiment of the present invention.

For example, as shown in FIG. 5A, an alternate laminate of silicon oxide films 29 and silicon films 30 is formed on a silicon substrate 21. If this laminate is etched by a mixed gas of $CF_4$ and $CHF_3$, a silicon film 30c having a lower etching rate is used as the film at the highest level of this alternate laminate.

A photoresist pattern 31 is formed on the alternate laminate. The silicon oxide film is etched at a flow ratio $CHF_3/(CF_4+CHF_3)$ of 1 to 2, and the polycrystalline silicon film 30 is etched at a flow ratio $CHF_3/(CF_4+CHF_3)$ of 0 to 0.2. The diameter of the opening of the resist pattern 31 is set to 0.4 μm and the etching is performed until the surface of the silicon substrate is exposed.

Figure 5B:
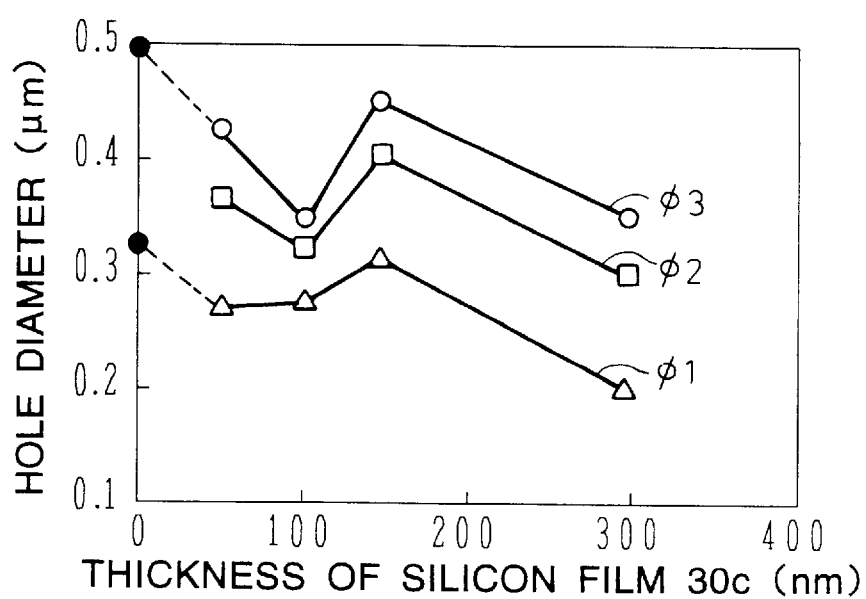

Samples were actually made by the above-described process. The diameters of the opening were measured which are shown in the graph of FIG. 5B. $\phi 1$ represents the diameter of the opening at the bottom surface of the silicon film at the highest level, $\phi 2$ represents the diameter of the opening at the bottom surface of the silicon film at the intermediate level, and $\phi 3$ represents the diameter of the opening at the surface of the silicon substrate. The abscissa represents the thickness of the silicon film 30c at the highest level in the unit of nm, and the ordinate represents the opening or hole diameter in the unit of μm. For the comparison sake, data of the opening diameter are also shown at 0 on the abscissa when the silicon oxide film is used as the film at the highest level.

As the etching progresses, the opening diameter of the photoresist pattern gradually increases and the unetched surface of the uppermost layer is exposed. If the uppermost layer of the laminate structure exposed in the broadened opening of the photoresist pattern has a higher etching rate, the opening diameter of the uppermost layer increases. If the uppermost layer has a lower etching rate, the pattern precision is more preferably maintained to some degree by the uppermost layer even if the broadened opening of the photoresist pattern exposes the unetched surface of the uppermost layer.

As shown in FIG. 5B, if the silicon film is used as the uppermost layer, the opening diameter $\phi 3$ at the bottom surface of the uppermost silicon film can be set nearer to the opening diameter of the resist pattern than if the silicon oxide film is used as the uppermost layer. In the experiments, a gentle taper etch was performed so that the opening diameter gradually reduces at the deeper position, from $\phi 3$ to $\phi 1$.

At the thickness of the uppermost silicon layer 30c of about 100 nm, the minimum hole diameter was obtained. Accordingly, if the thickness of the uppermost silicon layer 30c is set to about 50 to 150 nm, a high stability of etch precision can be obtained.

The present invention has been described in connection with the preferred embodiments. The invention is not limited only to the above embodiments. It is apparent to those skilled in the art that various modifications, improvements, combinations and the like can be made without departing from the scope of the appended claims.

We claim:

1. A method of manufacturing a semiconductor device, said method comprising the steps of:

providing a substrate having a surface and an alternating laminate of silicon film and silicon oxide film disposed on the surface;

forming an etching mask on the alternating laminate;

loading said substrate into a dry etching chamber;

selecting at least a first gas for positively performing etching from one of three groups A, B, and C, and at least a second gas for positively performing etching from another of said three groups A, B, and C, the group A consisting of $NF_3$, $CF_4$, and $SF_6$, the group B consisting of CO, $CHF_3$, $CH_2F_2$, $C_2F_6$, $C_3F_8$, and $C_4F_8$, and the group C having oxidizing nature but not containing oxygen, and consisting of $Cl_2$, HBr, $Br_2$, and HCl;

mixing the first gas and the second gas in a first ratio to provide a first etching gas composition;

etching one of said silicon film and said silicon oxide film with the first etching gas composition;

mixing the first gas and the second gas in a second ratio, different from the first ratio, to yield a second etching gas composition; and etching the other of said silicon film and said silicon oxide film with the second etching gas composition, directly following said step of etching one of said silicon film and said silicon oxide film, wherein said etching steps etch through said alternating laminate using the etching mask as a mask to form an alternating laminate pattern with edges aligned with edges of said etching mask, and exposed to the etching gas compositions.

2. A method according to claim 1, wherein each of said first and second etching gas compositions includes $CF_4$ and $CHF_3$.

3. A method according to claim 1, wherein each of said first and second etching gas compositions includes $CHF_3$ and $Cl_2$.

4. A method according to claim 1, wherein each of said first and second etching gas compositions includes $SF_6$ and HBr.

5. A method according to claim 1, wherein one of said first and second gases selectively etches only one of said silicon film and said silicon oxide film.

6. A method according to claim 1, wherein at said etching steps a taper shape etch is performed by selecting said first and second ratios, a total pressure in the chamber, and a plasma power.

7. A method according to claim 1, wherein said alternating laminate has an uppermost film formed of one of silicon and silicon oxide which has a lower cumulative etching rate than the other of silicon and silicon oxide when etched by one of said first and second etching gas compositions.

8. A method according to claim 1, wherein at said etching steps, a vertical shape etch is performed by selecting said first and second ratios, a total pressure in the chamber, and a plasma power.

9. A method according to claim 1, further comprising the step of monitoring emission of a reaction product generated in etching either silicon film or silicon oxide film in said etching steps.

10. A method according to claim 1, further comprising the step of monitoring emission of reaction products generated in etching silicon film and in etching silicon oxide film in said etching steps.

11. A method according to claim 10, wherein said step of monitoring is done with two emission monitors.

* * * * *